United States Patent
Teng

(10) Patent No.: US 7,617,355 B2
(45) Date of Patent: *Nov. 10, 2009

(54) PARITY-SCANNING AND REFRESH IN DYNAMIC MEMORY DEVICES

(75) Inventor: Tom Teng, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 22 days.

This patent is subject to a terminal disclaimer.

(21) Appl. No.: 11/758,041

(22) Filed: Jun. 5, 2007

(65) Prior Publication Data

US 2007/0229525 A1   Oct. 4, 2007

Related U.S. Application Data

(63) Continuation of application No. 11/473,311, filed on Jun. 23, 2006, now Pat. No. 7,240,148, which is a continuation of application No. 10/680,170, filed on Oct. 8, 2003, now Pat. No. 7,107,390.

(51) Int. Cl.
G06F 12/16 (2006.01)

(52) U.S. Cl. .................. 711/105; 714/773; 711/106

(58) Field of Classification Search .................. None
See application file for complete search history.

(56) References Cited

U.S. PATENT DOCUMENTS

| 4,528,665 | A | 7/1985 | Burns et al. |
|---|---|---|---|
| 4,682,328 | A | 7/1987 | Ramsay et al. |
| 4,888,773 | A | 12/1989 | Arlington et al. |
| 4,943,960 | A | 7/1990 | Komatsu et al. |
| 5,311,520 | A | 5/1994 | Raghavachari |
| 5,651,131 | A | 7/1997 | Chesley |
| 6,097,658 | A | 8/2000 | Satoh et al. |
| 6,414,687 | B1 | 7/2002 | Gibson |
| 6,430,073 | B1 | 8/2002 | Batson et al. |
| 6,678,786 | B2 | 1/2004 | Srinivasan et al. |
| 6,700,827 | B2 | 3/2004 | Lien et al. |
| 6,760,881 | B2 * | 7/2004 | Batson et al. ............... 714/773 |
| 7,107,390 | B2 | 9/2006 | Teng |
| 2002/0067632 | A1 | 6/2002 | Batson et al. |
| 2003/0007408 | A1 | 1/2003 | Lien et al. |
| 2004/0120173 | A1 | 6/2004 | Regev et al. |

* cited by examiner

*Primary Examiner*—Reginald G Bragdon
*Assistant Examiner*—Thanh D Vo
(74) *Attorney, Agent, or Firm*—Dickstein Shapiro LLP

(57) ABSTRACT

A method and apparatus that coordinates refresh and parity-scanning in DRAM-based devices such that parity-scan operations substitute for refresh operations when both operations are required in the system. The process of parity-scanning automatically refreshes the entries being scanned, subject to refresh and parity-scan interval requirements. As such, refresh and parity-scan operations may be performed in a single operation, which bolsters the scheduling and performance of the two operations.

22 Claims, 7 Drawing Sheets

PARITY-SCANNING AND REFRESH IN DYNAMIC MEMORY DEVICES

This application is a continuation of application Ser. No. 11/473,311, filed on Jun. 23, 2006 now U.S. Pat. No. 7,240,148, which is a continuation of application Ser. No. 10/680,170, filed on Oct. 8, 2003, now U.S. Pat. No. 7,107,390, which are hereby incorporated by reference in their entireties.

FIELD OF THE INVENTION

The invention relates generally to dynamic memory, and more particularly to coordinating refresh commands and parity-scan commands in a dynamic random access memory-based device.

BACKGROUND OF THE INVENTION

An essential semiconductor device is semiconductor memory, such as a random access memory (RAM) device. A RAM allows a memory circuit to execute both read and write operations on its memory cells. Typical examples of RAM devices include dynamic random access memory (DRAM) and static random access memory (SRAM) devices.

DRAM is a specific category of RAM containing an array of individual memory cells, where each cell includes a capacitor for holding a charge and a transistor for accessing the charge held in the capacitor. The transistor is often referred to as the access transistor or the transfer device of the DRAM cell.

FIG. 1 illustrates a portion of a DRAM memory circuit containing two neighboring DRAM cells 100. Each cell 100 contains a storage capacitor 102 and an access transistor or transfer device 101. For each cell 100, one side of the storage capacitor 102 is connected to a reference voltage (illustrated as a ground potential for convenience purposes). The other side of the storage capacitor 102 is connected to the drain of the transfer device 101. The gate of the transfer device 101 is connected to a word line 104. The source terminal of the transfer device 101 is connected to a bit line 103. With the memory cell 100 components connected in this manner, it is apparent that the word line 104 controls access to the storage capacitor 102 by allowing or preventing the signal (representing a logic "0" or a logic "1") carried on the bit line 103 to be written to or read from the storage capacitor 102. Thus, each cell 100 contains one bit of data (i.e., a logic "0" or logic "1").

Another form of memory is the content addressable memory (CAM) device. A CAM is a memory device that accelerates any application requiring fast searches of a database, list, or pattern, such as in database machines, image or voice recognition, or computer and communication networks. CAMs provide benefits over other memory search algorithms by simultaneously comparing the desired information (i.e., data in a comparand register) against an entire list of pre-stored entries. As a result of their unique searching algorithm, CAM devices are frequently employed in network equipment, particularly routers and switches, computer systems and other devices that require rapid content searching.

In order to perform a memory search in the above-identified manner, CAMs are organized differently than other memory devices (e.g., DRAM). For example, data is stored in a RAM in a particular location, called an address. During a memory access, the user supplies an address and writes into or reads the data at the specified address.

In a CAM, however, data is stored in locations in a somewhat random fashion. The locations can be selected by an address bus, or the data can be written into the first empty memory location. Every memory location includes one or more status bits that maintain state information regarding the memory location. For example, each memory location may include a valid bit whose state indicates whether the memory location stores valid information, or whether the memory location does not contain valid information (and is therefore available for writing).

Once information is stored in a CAM memory location, the information may be found by comparing every bit of memory with data in the comparand register. When the content stored in the CAM memory location does not match the data in the comparand register, a local match detection circuit returns a no match indication. When the content stored in the CAM memory location matches the data in the comparand register, the local match detection circuit returns a match indication. If one or more local match detect circuits return a match indication, the CAM device returns a "match" indication. Otherwise, the CAM device returns a "no-match" indication. In addition, the CAM may return the identification of the address location in which the desired data is stored (or one of such addresses if more than one address contained matching data). Thus, with a CAM, the user supplies the data and gets back the address if there is a match found.

FIG. 2 is a circuit diagram showing a conventional DRAM-based CAM cell 200 that includes two one-transistor DRAM cells 210a, 210b and a four-transistor comparator circuit 220 made up of transistors Q2, Q3, Q5 and Q6. The DRAM cells 210a, 210b are used to store values in the CAM cell 200. Generally, the content of the first DRAM cell 210a is the logical complement of the content of the second DRAM cell 210b. However, the cells 210a, 210b may also store the same values, i.e., "1", "1", or "0", "0", when so desired.

The first DRAM cell 210a includes transistor Q1 and capacitor CA, which combine to form storage node A that receives a data value from bit line BL1 at node U during write operations, and applies the stored data value to the gate terminal of transistor Q2 of the comparator circuit 220. Transistor Q2 is connected in series with transistor Q3, which is controlled by a data signal transmitted on data line D1, between a match line M and a discharge line D. The second DRAM cell 210b includes transistor Q3 and capacitor CB, which combine to form storage node B that receives a data value from bit line BL2 at node V, and applies the stored data value to the gate terminal of transistor Q5 of the comparator circuit 220. Transistor Q5 is connected in series with transistor Q6, which is controlled by a data signal transmitted on inverted data line D1#, between the match line M and the discharge line D.

FIG. 3 is a block diagram of a portion of a CAM device 300 that includes a plurality of CAM cells such as the CAM cell 200 illustrated in FIG. 2. For purposes of simplicity, only a portion of the CAM device 300 is illustrated in FIG. 3. In particular, some well known components such as e.g., the previously discussed comparand register, control logic, and input/output logic are not illustrated merely to simplify FIG. 3. The CAM device 300 includes two arrays 310a, 310b of CAM cells 200. Each array 310a, 310b includes its own bit lines (i.e., BL11-BL16 for the first array 310a, BL21-BL26 for the second array 310b) and word lines (i.e., WL11-WL13 for the first array 310a and WL21-WL23 for the second array 310b). Each word line WL11-WL13, WL21-WL23 is also coupled to a respective word line driver 320a, 320b. Similarly, each bit line BL11-BL16, BL21-BL26 is also coupled to respective bit line drivers (not illustrated). The CAM device 300 also includes a plurality of sense amplifiers 330. Each sense amplifier 330 is coupled to the CAM cells 200 connected to two different bit lines (e.g., bit lines BL11, BL21)

from two different arrays 310a, 310b. This type of architecture, where a sense amplifier is coupled to bit lines from different arrays, is generally known as an open bit line architecture.

One of the drawbacks associated with DRAM cells is that the charge on the storage capacitors may naturally decay over time, even if the capacitors remain electrically isolated. Thus, DRAM cells require periodic refreshing. Additionally, refreshing is also required after a memory cell has been accessed, for example, as part of a read operation.

In DRAM-based devices, refresh commands are issued periodically to keep the contents of the DRAM memory array maintained at their previously stored values. The refresh operations have the effect of restoring charges lost from DRAM cells due to leakage currents. Refresh operations are also essential for ensuring that data in the DRAM memory is not corrupted over time. For proper DRAM operation, the device adheres to minimum operating specifications and maintains a periodic interval for issuing refresh commands.

Refresh commands may be issued explicitly to the DRAM-based device from another device such as e.g., a memory controller. Refresh operations may also be internally generated during idle cycles, with the controller concurrently ensuring that a sufficient number of idle cycles are interspersed in the command stream to meet the device's refresh requirements. This is known as a "self-refresh."

Although refreshes allow DRAM memory to retain previously stored values, soft-errors and coupling defects can still occur that would falsely toggle a stored bit. If this erroneous toggling has occurred, future refresh operations would refresh the false value. One method of mitigating the problem of false toggling of stored data bits includes storing parity bits with the data. The memory array is periodically parity-scanned to determine if any errors have occurred. Parity-scanning may be performed internally whenever there are idle cycles. System hardware running in the background monitors the command stream to see when it can insert a parity-scan command. However, unlike refresh operations, parity-scanning is typically performed on a best-effort policy (as opposed to all inclusive policy). This means that all rows may not have been scanned by the end of the parity-scan time interval.

Accordingly, there is a desire and need to coordinate refresh and parity-scan operations in a DRAM-based device.

BRIEF SUMMARY OF THE INVENTION

The invention provides a method and apparatus for coordinating refresh and parity-scan operations in a DRAM-based device.

The process of parity-scanning involves reading entries from the memory array, and checking that the parity bits that were stored with the entries are still consistent with current parity calculations. For most DRAM devices, read operations automatically refresh the entry being read, restoring charges that may have leaked away from the DRAM cells over time. Therefore, as parity-scan involves reading the array as part of its process, it may be considered as a viable substitute for refresh operations whose sole purpose is to renew rather than check the content of stored entries, but not vice versa.

The above and other features and advantages are achieved in various embodiments of the invention by providing a method and apparatus that coordinates refresh and parity-scanning commands in DRAM-based devices such that parity-scan operations substitute for refresh operations when both operations are required in the system. The process of parity-scanning automatically refreshes the entries being scanned, subject to refresh and parity-scan interval requirements. As such, refresh and parity-scan operations may be performed in a single operation, which bolsters the scheduling and performance of the two operations.

BRIEF DESCRIPTION OF THE DRAWINGS

The forgoing and other advantages and features of the invention will be more clearly understood from the following detailed description of the invention which is provided in connection with the accompanying drawings, in which.

DETAILED DESCRIPTION OF THE INVENTION

The invention overlaps and coordinates the refresh and parity-scan operations in DRAM devices and DRAM-based devices (such as e.g., CAM devices). The two operations are not treated as separate processes. Both operations are periodic and involve reading the contents of the DRAM memory. As used herein, "parity refresh" or "refresh scan" refers to any operation that performs both refresh and parity-scan functions on the DRAM memory cells.

The following definitions are used herein: numRows=number of rows per bank; numBanks=number of banks; numRowsTot=numRows * numBanks=number of total rows; tRef=maximum refresh interval for a row; tScanTot=maximum time interval by the end of which it is desirable to have all rows parity-scanned; and tScan=tScanTot/numRows=maximum parity-scan interval for a row.

If tref<tScan, refresh operations will occur more frequently than parity-scan operations. Each refresh command, whether generated internally as a self-refresh operation or issued explicitly from another device, may cause rows at the same row address (but residing in different banks) to be refreshed simultaneously. Alternatively, each refresh command may cause only one row in one bank to be refreshed at a time, proceeding from one bank to the next only when all rows in the former bank have been refreshed. The first approach of refreshing rows at the same row address simultaneously requires fewer refresh commands to refresh the entire memory array, but will consume more power per refresh than the second approach.

Likewise, each parity-scan command, whether generated internally or issued from another device, may cause rows at the same row address (but residing in different banks) to be parity-scanned simultaneously, or may cause only one row in one bank to be parity-scanned at a time, proceeding from one bank to the next only when all rows in the former have been scanned. The first approach of scanning rows at the same row address simultaneously requires fewer parity-scan commands to scan the entire memory array, but will consume more power per parity-scan and may require more circuitry to implement than the second approach.

The scenario where only one row in one bank is refreshed or parity-scanned at a time may be logically treated in the following discussions as numBanks=1 (although physically the device may have multiple banks; numBanks is used in this situation to denote the number of banks that are being refreshed or parity scanned simultaneously), and numRows=numRowsTot, since it would require numRowsTot refreshes or parity-scanning operations to go through the entire array once.

Figure 1:
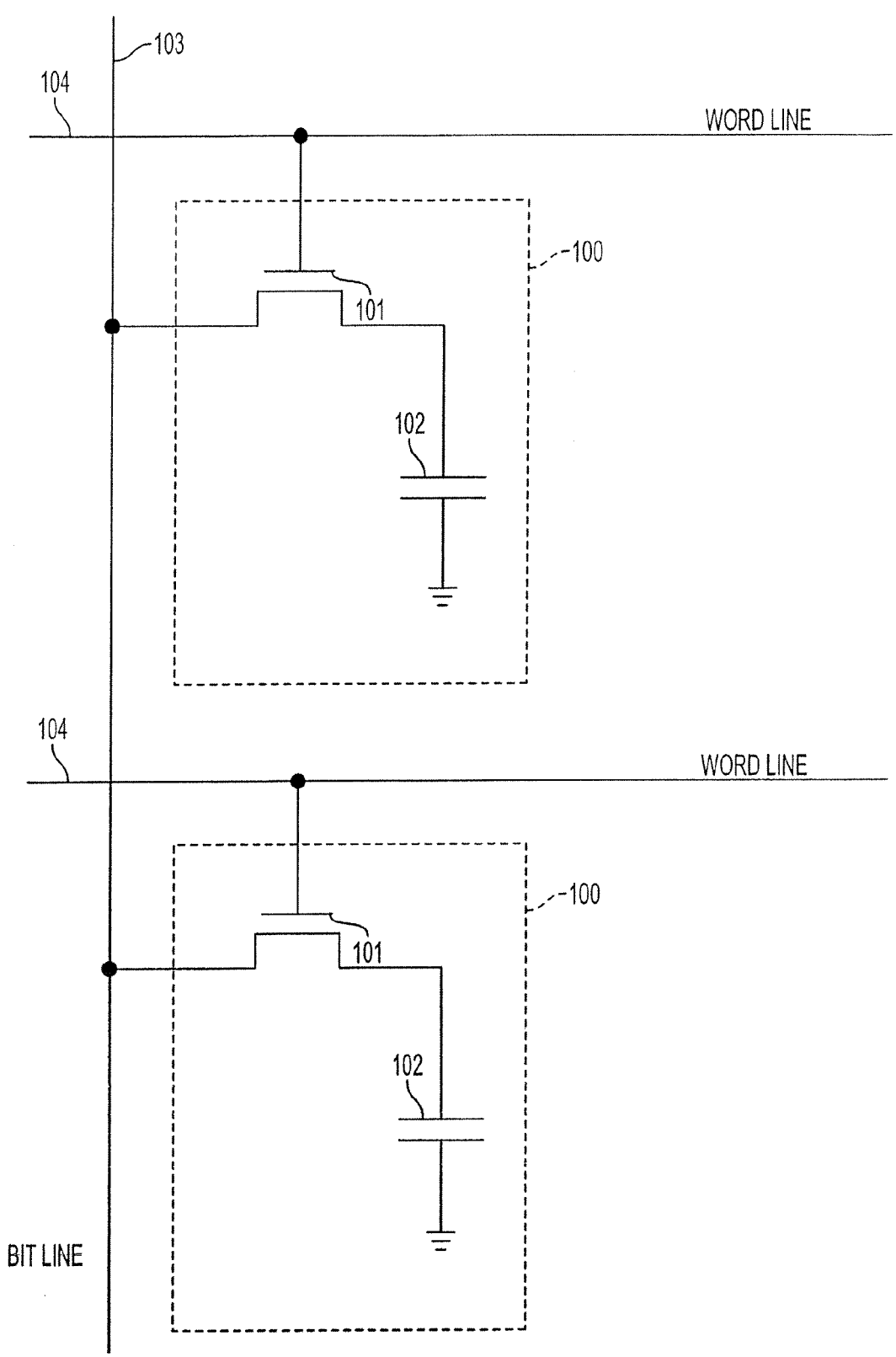
FIG. 1 is a circuit diagram depicting conventional dynamic random access memory (DRAM) cells.
Figure 2:
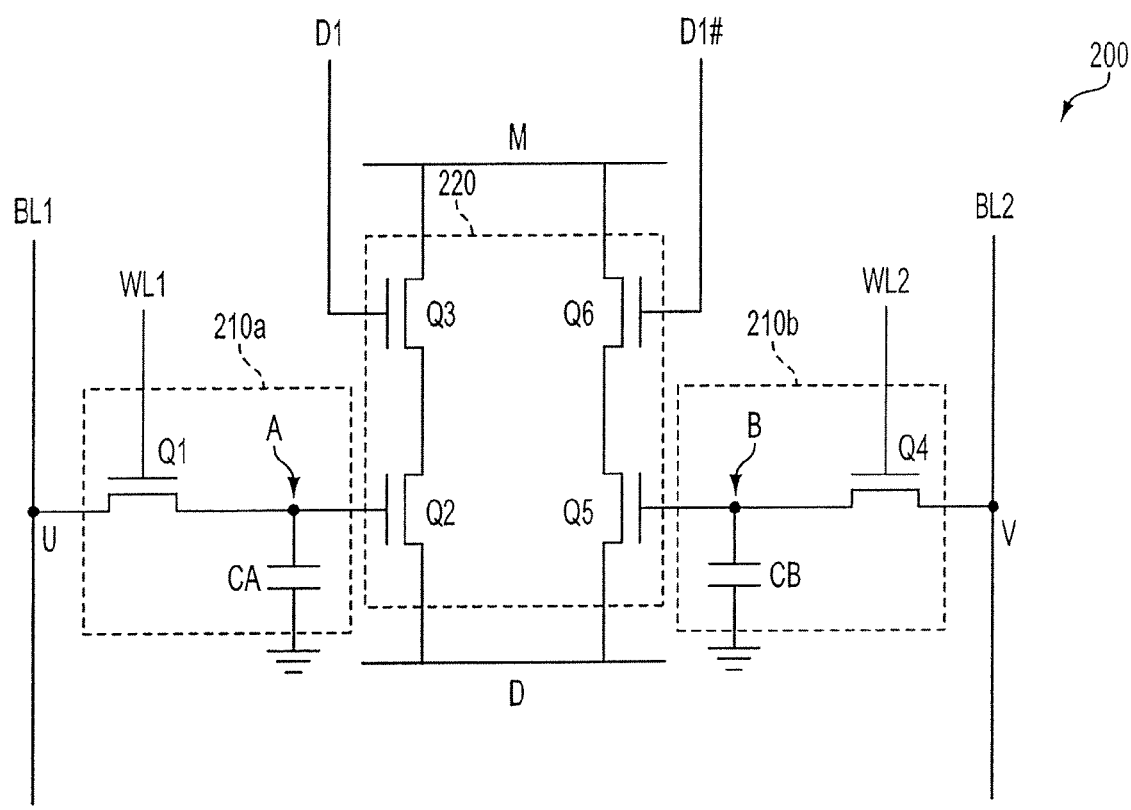
FIG. 2 is a circuit diagram of a conventional six-transistor DRAM based CAM cell.
Figure 3:
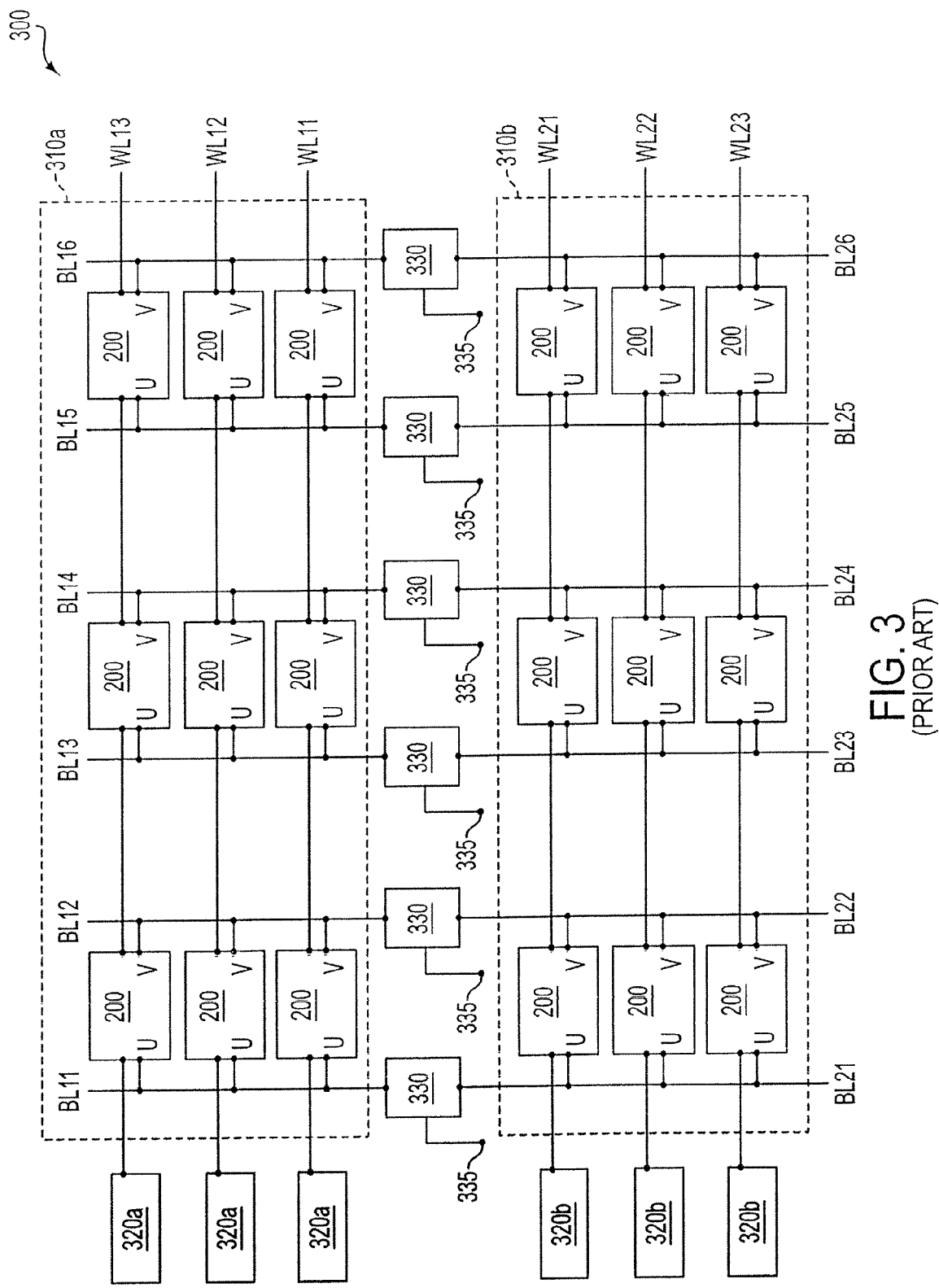
FIG. 3 is a block diagram depicting a conventional CAM device.
Figure 4:
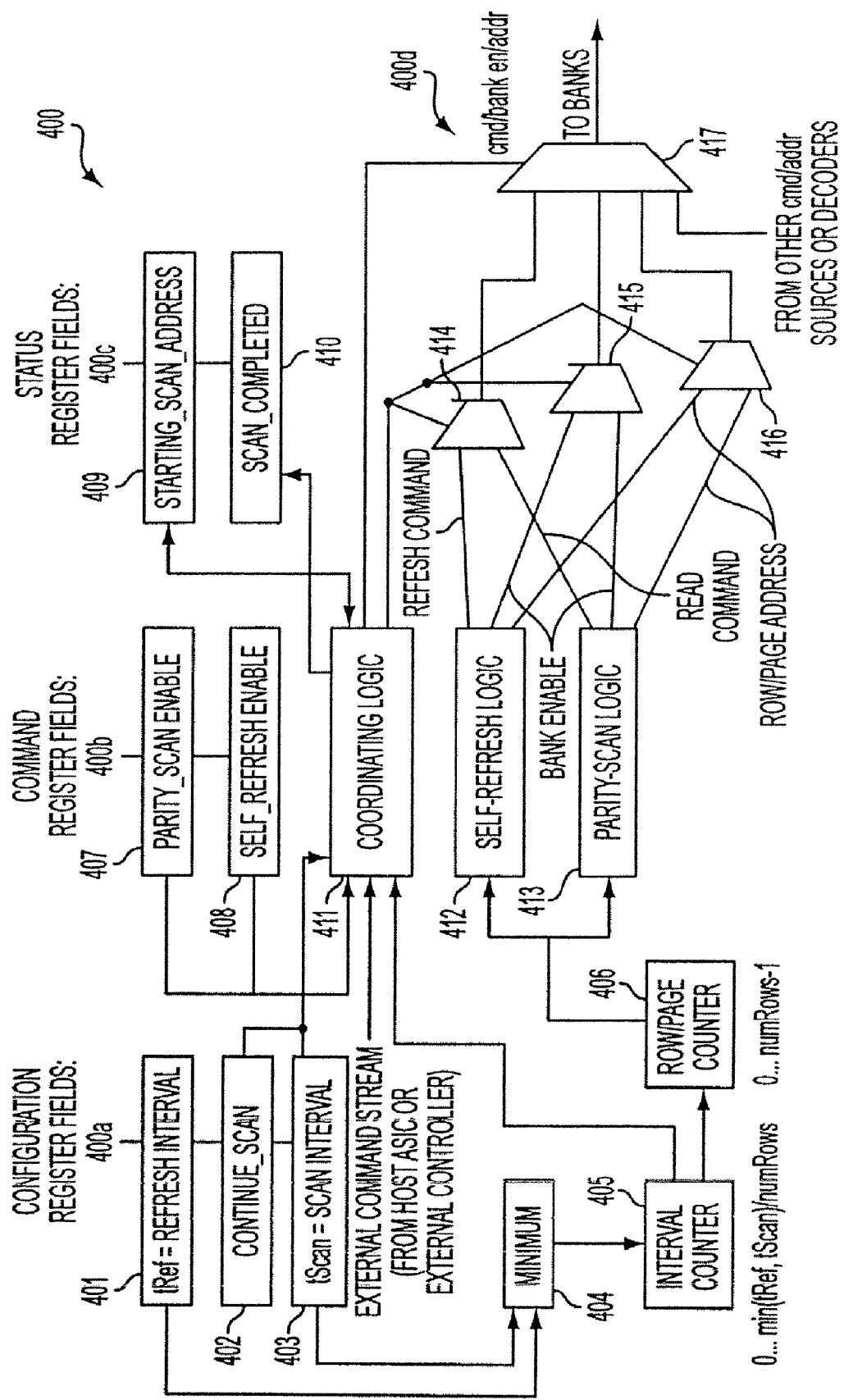
FIG. 4 is a diagram illustrating an exemplary circuit for coordinating refresh and parity-scanning operations constructed in accordance with an embodiment of the invention.

Referring to the drawings, an exemplary embodiment of a circuit 400 for coordinating refresh and parity-scanning is shown in FIG. 4. The circuit 400 may be considered as having four portions: configuration register fields 400a, command register fields 400b, status register fields 400c and control logic 400d.

The configuration register fields 400a include tRef and tScan (defined above) configuration register fields 401, 403, which may be either hardwired or initialized to certain values upon reset. A continue_scan register field 402 (described below) is also included. The command register fields 400b include parity_scan and self_refresh enable register fields 407, 408. The status register fields 400c include starting_scan_address and scan_completed register fields 409, 410. The use of the configuration register fields 400a, command register fields 400b and status register fields 400c is discussed below in more detail.

The control logic 400d includes minimum logic 404, an interval counter 405, a row/page counter 406, coordinating logic 411, self-refresh logic 412, parity-scan logic 413, and four multiplexers 414, 415, 416, 417. The components within the control logic 400d are described below in more detail.

Minimum logic 404 is a comparator that selects the smaller of the tRef and tScan configuration register fields 401, 403 and sends that value to the interval counter 405. The number of rows per bank (numRows) is hardwired or stored in the interval counter 405. The interval counter 405 takes the value selected by the minimum logic 404 and divides that value by numRows to generate a wrap-around limit, such that whenever the interval counter 405 reaches this limit and returns to zero, an increment signal is sent to the row/page counter 406. The row/page counter 406 tracks the next row to be refreshed or parity-scanned based on the increment signal.

The self-refresh logic 412 and parity-scan logic 413 use the row address tracked by row/page counter 406 to generate sequences of command, bank enable, and/or row/page addresses, which are appropriate for their respective operations. The first three multiplexers 414, 415, 416, as controlled by the coordinating logic 411, select the appropriate command (i.e., refresh or read), bank enable, or row/page address and output the selected information to the fourth multiplexer 417. The fourth multiplexer 417, as controlled by the coordinating logic 411, selects and outputs one of the outputs from the first three multiplexers 414, 415, 416, or an output from other command/address sources or decoders.

In addition, the parity-scan logic 413 contains hardware to check the parities returned from memory to ensure data integrity. The parity-scan enable and self-refresh enable register fields 407, 408 may be provided to turn off either the parity-scan or self-refresh logic 413, 412. The coordinating logic 411 checks the command stream for idle cycles to insert parity-scan or refresh commands, upon selecting between the two operations.

The row after the last row that was refreshed or scanned (before the current tScanTot period expires) can be saved into the starting_scan_address status register field 409. This value then serves as the starting address for the next scan iteration. The scan_completed status register field 410 may be provided to indicate that all rows have been scanned before the end of a scan period, if set.

There are four scenarios where refresh operations may be implemented. Two of the scenarios include internally generated refresh and parity-scan operations within the device for the cases where tRef<tScan and tRef>tScan. The other two scenarios use externally generated refreshes, while parity-scanning is internally generated, for the cases where tref<tScan and tRef>tScan.

For the first scenario (i.e., internally generated refresh and parity-scan for tRef<tScan), the rate at which refresh operations occur is high enough (usually guaranteed by the presence of adequate idle cycles from external logic) that parity-scanning would most likely be completed through all of the rows within a tScanTot period. At least initially, parity-scan commands can be issued for the dual-purpose of performing scan and refresh operations. Upon completion of scanning through all rows and before tScanTot has expired, system requirements may specify:

(1) A wrap-around to the starting row, and continue with parity-scanning. This would effectively replace refresh operations with parity-scan operations, until the parity-scan logic 413 is disabled (by clearing the parity_scan enable command register field 407); or (2) The stopping of parity-scanning operations and continuing with refresh operations until the start of the next tScanTot period. This may result from the parity-scans consuming more power than desired. In this case, the coordinating logic 411 would switch to the output of the self-refresh logic 412, whenever there are idle cycles, for the remainder of the current tScanTot period. The preference for which approach to follow may be indicated in the continue_scan configuration register field 402.

For the second scenario (i.e., internally generated refresh for tRef>tScan), the external logic usually guarantees enough idle cycles to meet refresh requirements, but may or may not guarantee enough idle cycles to satisfy the higher parity-scan frequency. As previously described, the policy for parity-scan may be best-effort only, and it is possible that not all of the rows will be scanned within a tScanTot period. However, since at least the required refresh frequency is guaranteed to be met, parity-scanning can be used for the dual-purpose of scan and refresh throughout the device's operation, until the parity-scan logic 413 is disabled, at which point the coordinating logic 411 switches the outputs of the first three multiplexers 414, 415, 416 to the output of the self-refresh logic 412 exclusively.

If all of the rows were not scanned by the end of a scan period (as indicated by comparing the starting_scan_address 409 and the output of row/page counter 406), then the scan_completed status register field 410 can be cleared so that a host ASIC or external controller can poll it and become notified. The next scan period would begin with the next row to be scanned, with its address stored in the starting_scan_address register field 409, so that all rows can be refreshed equally during the process.

The third scenario (i.e., externally generated refresh for tRef<tScan) is similar to the first scenario (i.e., internally generated refresh for tRef<tScan). A difference arises, however, from having the refreshes explicitly issued to the device from an external mechanism. As explained above, parity-scan operations may initially be used to substitute for the refresh operations until all rows have been scanned (prior to the end of tScanTot period). Thereafter, either refresh or parity-scan commands can be used to satisfy refresh requirements, as indicated by the continue_scan configuration field 402. If the continue-scan field is set, indicating to continue using parity-scan to substitute for refresh in spite of the fact that all rows have already been scanned within the current tScanTot interval, then the refresh logic may be disabled. Upon receiving an external refresh command, the coordinating logic may direct the parity-scan logic to send a parity-scan command in its place.

The fourth scenario (i.e., externally generated refresh for tRef>tScan) is similar to the second scenario (i.e., internally generated refresh for tRef>tScan). A difference arises, however, from having the refreshes explicitly issued to the device from an external mechanism. As explained above, parity-scan operations may be used to substitute for the refresh operations throughout the DRAM-based device's operation (at least when parity-scan is enabled). If all of the rows are not scanned by the end of tScanTot period, it is preferable that scanning in the next scan period be resumed from the current row location, rather than starting from the first row; this way, all rows can be refreshed equally. The self-refresh logic 412 may be disabled, and the command stream is fed to both the coordinating logic 411 and the first three multiplexers 414, 415, 416.

Figure 5:
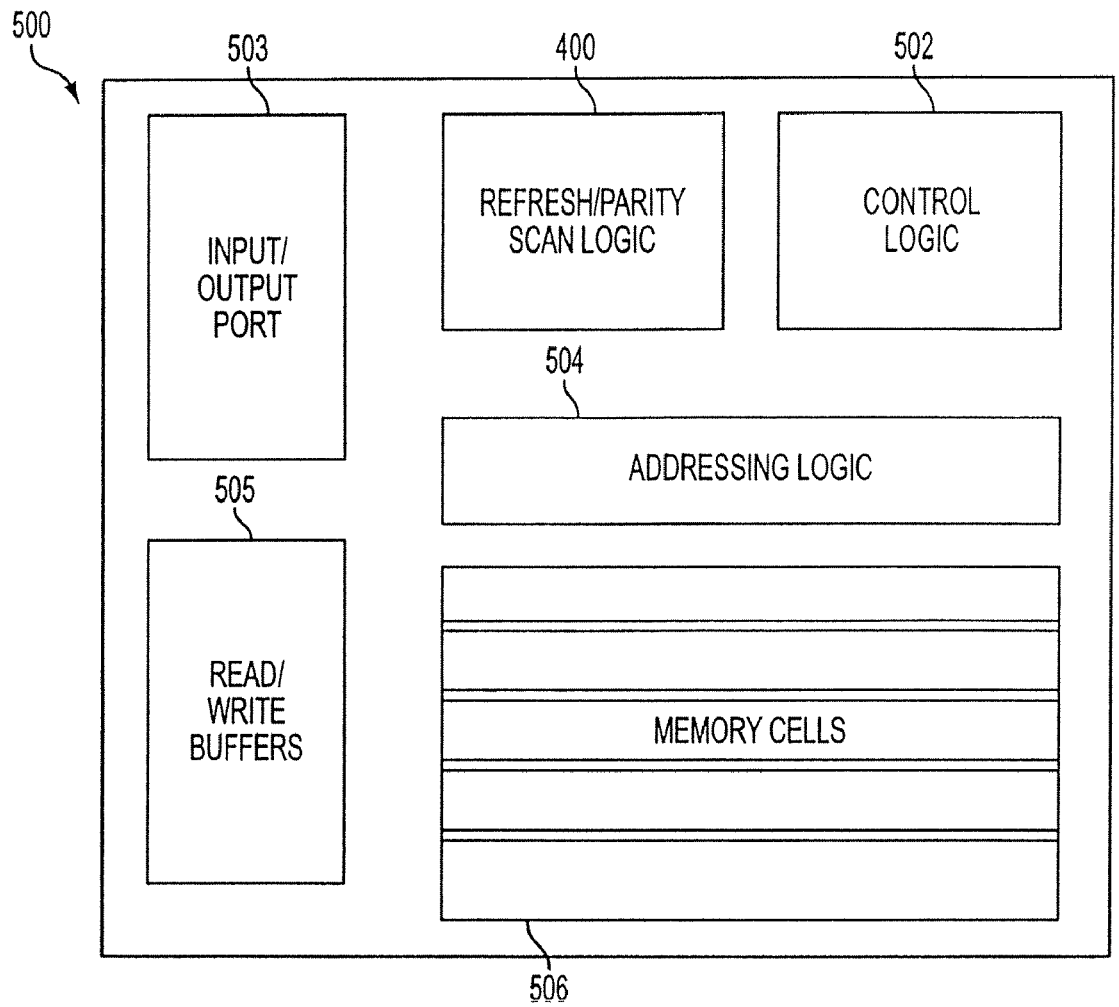
FIG. 5 is a block diagram depicting an exemplary semiconductor chip implementing the refresh and parity scan logic illustrated in FIG. 4.

FIG. 5 is a semiconductor chip 500 embodying the refresh and parity-scanning logic of the invention. The semiconductor chip 500 incorporates refresh/parity scan logic 400 constructed in accordance with the invention as shown in FIG. 4. The semiconductor chip 500 also comprises control logic 502, an input/output port 503, addressing logic 504, read/write buffers 505 and DRAM-based memory cells 506.

Figure 6:
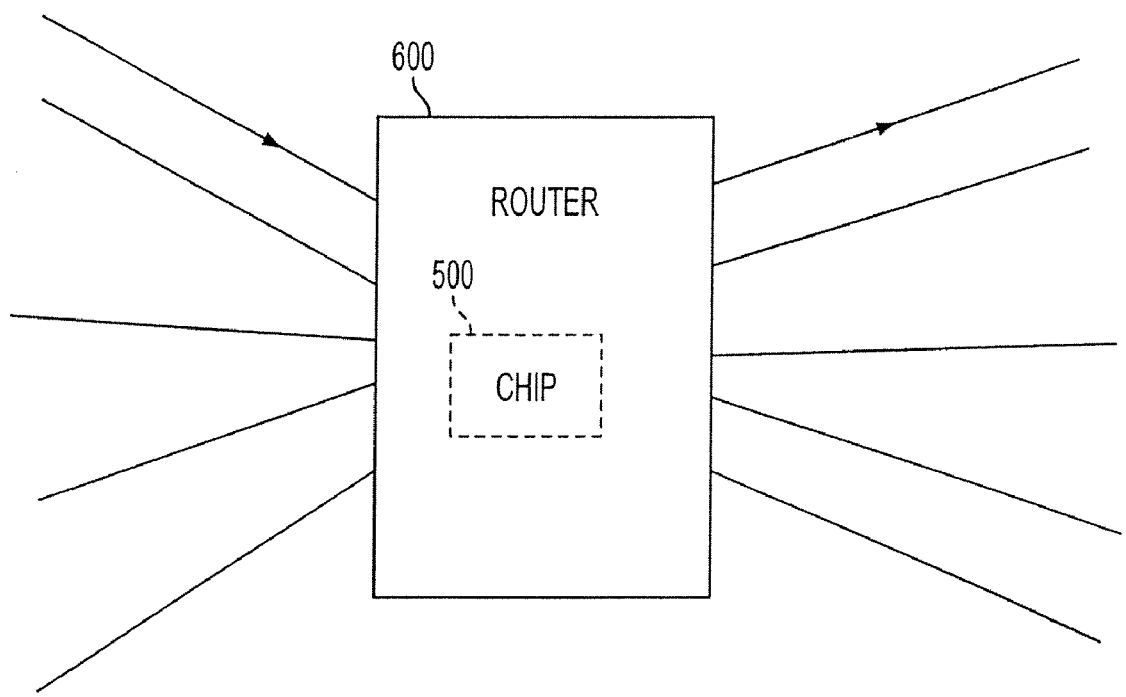
FIG. 6 is a simplified block diagram depicting a packet router employing the FIG. 5 semiconductor chip in accordance with another exemplary embodiment of the invention.

FIG. 6 is a simplified block diagram of an embodiment of a packet router 600 as may be used in a communications network, such as, e.g., part of the Internet backbone. The router 600 contains a plurality of input lines and a plurality of output lines. When data is transmitted from one location to another, it is sent in a form known as a packet. Oftentimes, prior to the packet reaching its final destination, that packet is first received by a router, or some other device. The router 600 then decodes that part of the data identifying the ultimate destination and decides which output line and what forwarding instructions are required for the packet.

Generally, devices such as CAMs utilizing DRAM based memory devices are very useful in router applications because historical routing information for packets received from a particular source and going to a particular destination is stored in the DRAM of the CAM device in the router. As a result, when a packet is received by the router 600, the router already has the forwarding information stored within its CAM. Therefore, only that portion of the packet that identifies the sender and recipient need be decoded in order to perform a search of the CAM to identify which output line and instructions are required to pass the packet onto a next node of its journey.

Still referring to FIG. 6, router 600 contains the added benefit of employing a semiconductor memory chip containing an array of cascaded CAM devices with DRAM memory, and also employing hardware for overlapping and coordinating refresh and parity-scanning in the DRAM memory, such as semiconductor chip 500 depicted in FIG. 5.

Figure 7:
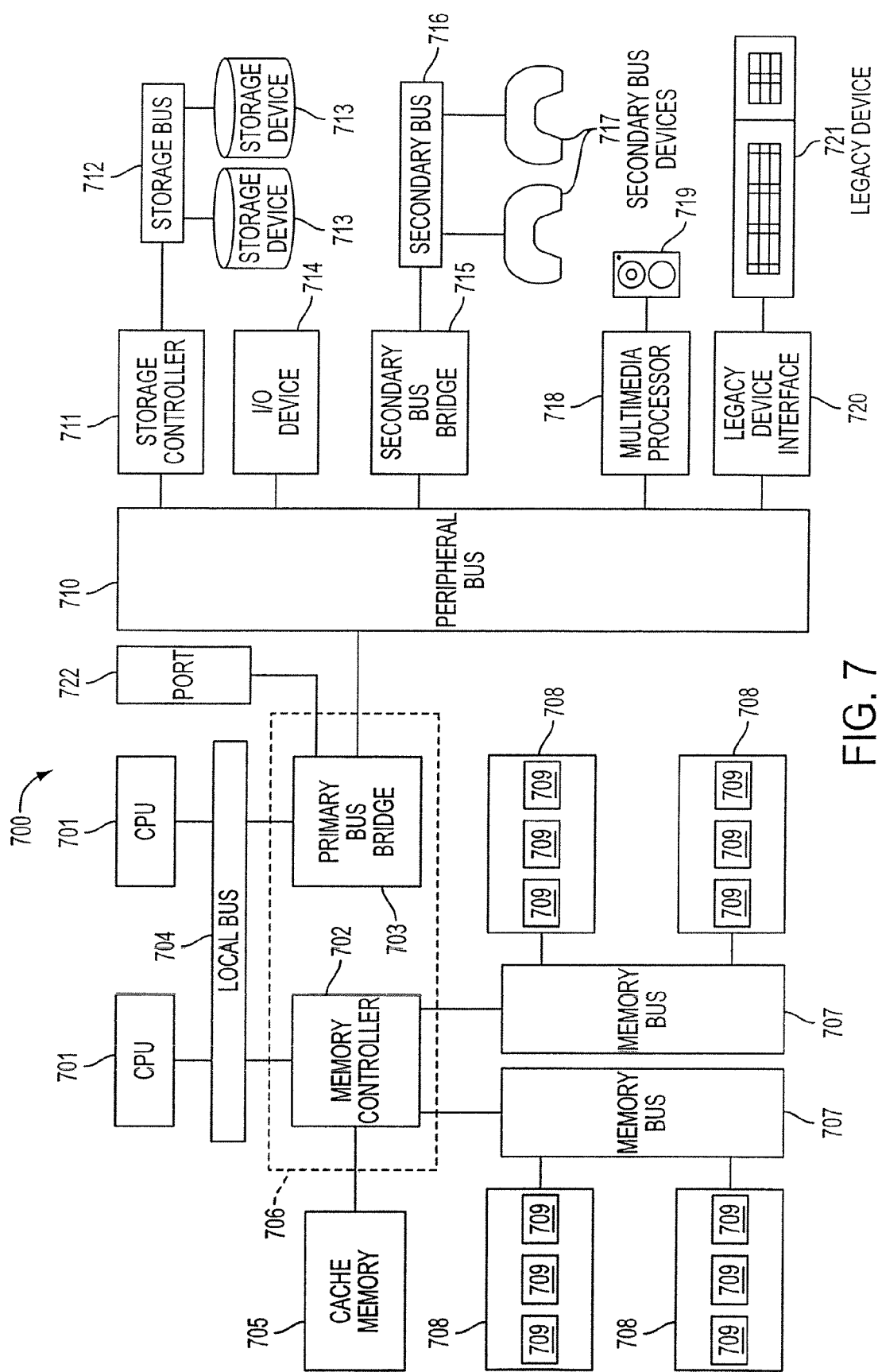
FIG. 7 is a block diagram depicting a processor system in accordance with another exemplary embodiment of the invention.

FIG. 7 illustrates an exemplary processing system 700 that utilizes a hardware device including for example, the device on semiconductor chip 500 of FIG. 5. The processing system 700 includes one or more processors 701 coupled to a local bus 704. A memory controller 702 and a primary bus bridge 703 are also coupled the local bus 704. The processing system 700 may include multiple memory controllers 702 and/or multiple primary bus bridges 703. The memory controller 702 and the primary bus bridge 703 may be integrated as a single device 706, which may include the hardware on semiconductor chip 500.

The memory controller 702 is also coupled to one or more memory buses 707. Each memory bus accepts memory components 708. Any one of memory components 708 may alternatively contain a hardware device such as the device described in connection with FIG. 4.

The memory components 708 may be a memory card or a memory module. The memory components 708 may include one or more additional devices 709. For example, in a SIMM or DIMM, the additional device 709 might be a configuration memory, such as a serial presence detect (SPD) memory and may additionally or alternatively contain a hardware device such as the device described in connection with FIG. 4. The memory controller 702 may also be coupled to a cache memory 705. The cache memory 705 may be the only cache memory in the processing system. Alternatively, other devices, for example, processors 701 may also include cache memories, which may form a cache hierarchy with cache memory 705. If the processing system 700 include peripherals or controllers which are bus masters or which support direct memory access (DMA), the memory controller 702 may implement a cache coherency protocol. If the memory controller 702 is coupled to a plurality of memory buses 707, each memory bus 707 may be operated in parallel, or different address ranges may be mapped to different memory buses 707.

The primary bus bridge 703 is coupled to at least one peripheral bus 710. Various devices, such as peripherals or additional bus bridges may be coupled to the peripheral bus 710. These devices may include a storage controller 711, a miscellaneous I/O device 714, a secondary bus bridge 715, a multimedia processor 718, and a legacy device interface 720. The primary bus bridge 703 may also be coupled to one or more special purpose high speed ports 722. In a personal computer, for example, the special purpose port might be the Accelerated Graphics Port (AGP), used to couple a high performance video card to the processing system 700.

The storage controller 711 couples one or more storage devices 713, via a storage bus 712, to the peripheral bus 710. For example, the storage controller 711 may be a SCSI controller and storage devices 713 may be SCSI discs. The I/O device 714 may be any sort of peripheral. For example, the I/O device 714 may be a local area network interface, such as an Ethernet card. The secondary bus bridge 715 may be used to interface additional devices via another bus to the processing system. For example, the secondary bus bridge 715 may be a universal serial port (USB) controller used to couple USB devices 717 via to the processing system 700. The multimedia processor 718 may be a sound card, a video capture card, or any other type of media interface, which may also be coupled to additional devices such as speakers 719. The legacy device interface 720 is used to couple legacy devices 721, for example, older styled keyboards and mice, to the processing system 700.

The processing system 700 illustrated in FIG. 7 is only an exemplary processing system with which the invention may be used. While FIG. 7 illustrates a processing architecture especially suitable for a general purpose computer, such as a personal computer or a workstation, it should be recognized that well known modifications can be made to configure the processing system 700 to become more suitable for use in a variety of applications. For example, many electronic devices which require processing may be implemented using a simpler architecture which relies on a CPU 701 coupled to memory components 708 and/or memory devices 709. The modifications may include, for example, elimination of unnecessary components, addition of specialized devices or circuits, and/or integration of a plurality of devices.

The parity-scan/refresh logic of the invention is preferably intended to be used as part of a DRAM-based memory, which in turn may be a component within a computer or other hardware system using DRAM to store and retrieve information, such as e.g., routers. If the DRAM-based memory is used within a computer system, the memory may be integrated into the microprocessor chip, i.e., as an on-chip cache; may operate on a separate chip that interfaces with the microprocessor via a high-speed processor bus; or may operate as an I/O device communicating with the microprocessor via an I/O bus such as the PCI bus. If the DRAM-based memory is used within an application-specific system such as routers, then it may be integrated as a subcomponent within a microprocessor or a host ASIC controlling its operation, or may interface to them via a system bus.

If the DRAM-based memory (and therefore the parity-scan/refresh logic of the invention) is used within a computer system, then the command and configuration registers may be written by a microprocessor. For example, if the memory design is a device residing on a PCI bus, the microprocessor can write to these registers by issuing a PCI write command. Likewise, the status registers may be read by a microprocessor in this case with a PCI read command. If the DRAM-based memory resides on the same chip as the microprocessor, then logic internal to the chip can set the command and configuration registers appropriately as well as read the status registers directly.

If the DRAM-based memory (and therefore the parity-scan/refresh logic of the invention) is used within an application-specific system such as a router, then the command and configuration registers may be written by a microprocessor within the router, or a host ASIC which controls the operation of the memory device.

While certain embodiments of the invention have been described and illustrated above, the invention is not limited to these specific embodiments as numerous modifications, changes and substitutions of equivalent elements can be made without departing form the spirit and scope of the invention. For example, although the invention has been described in connection with a specific circuit employing a configuration of register fields and logic, the invention may be practiced with many other configurations without departing from the spirit and scope of the invention. Accordingly, the scope of the invention is not to be considered as limited by the specifics of the particular structures and processes which have been described and illustrated herein, but is only limited by the scope of the appended claims.

What is claimed as new and desired to be protected by Letters Patent of the United States is:

1. A method of operating a memory device comprising:
   determining whether a parity-scan operation can be substituted for a refresh operation; and
   performing the parity-scan operation instead of the refresh operation when it is determined that the parity-scan operation can be substituted for the refresh operation.

2. The method of claim 1 further comprising the step of performing parity-scan operations instead of refresh operations in a scan period until all rows in the memory device have been parity-scanned.

3. The method of claim 2, wherein on completion of scanning all rows and before a maximum time interval in which it is desirable to have all rows parity-scanned has expired, the method further comprises continuing the performance of parity-scan operations instead of refresh operations at a first row of the device.

4. The method of claim 2, wherein on completion of scanning all rows and before a maximum time interval in which it is desirable to have all rows parity-scanned has expired, the method further comprises performing refresh operations at a first row of the device until it is time to perform another parity-scan operation.

5. The method of claim 1 further comprising the step of performing parity-scan operations for a dual purpose of performing scan and refresh operations for rows in the memory device until a maximum time interval in which it is desirable to have all rows parity-scanned has expired.

6. The method of claim 1 further comprising the steps of:
   performing parity-scan operations for a dual purpose of performing scan and refresh operations in a first scan period for rows in the memory device; and
   performing parity-scan operations for the dual purpose of performing scan and refresh operations in a second scan period for other rows in the memory device.

7. The method of claim 1 further comprising the step of scheduling the refresh operations when it is determined that the parity-scan operations cannot be substituted for refresh operations.

8. The method of claim 1 further comprising the step of checking parities returned from the memory device to ensure data integrity.

9. A memory device comprising:
   a plurality of memory cells organized as an array of rows and columns;
   parity-scan logic adapted to perform parity scan operations on the memory cells;
   a plurality of register fields, said register fields containing at least configuration information regarding the memory device; and
   control logic coupled to the register fields, said control logic using the information in the register fields to determine whether a parity-scan operation can be substituted for a refresh operation and to control the parity-scan logic to perform the parity-scan operation instead of the refresh operation when it is determined that the parity-scan operation can be substituted for the refresh operation.

10. The memory device of claim 9, wherein the control logic controls the parity-scan logic to perform parity-scan operations instead of refresh operations in a scan period until all rows in the memory device have been parity-scanned.

11. The memory device of claim 10, wherein on completion of scanning all rows and before a maximum time interval in which it is desirable to have all rows parity-scanned has expired the control logic controls the parity-scan logic to continue the performance of parity-scan operations instead of refresh operations at a first row of the device.

12. The memory device of claim 10 further comprising self-refresh logic connected to the control logic, wherein on completion of scanning all rows and before a maximum time interval in which it is desirable to have all rows parity-scanned has expired the control logic controls the self-refresh logic to perform refresh operations at a first row of the device until it is time to perform another parity-scan operation.

13. The memory device of claim 9, wherein the control logic controls the parity-scan logic to perform parity-scan operations for a dual purpose of performing scan and refresh operations for rows in the memory device until a maximum time interval in which it is desirable to have all rows parity-scanned has expired.

14. The memory device of claim 9, wherein the parity-scan and refresh operations occur during a same scan period.

15. The memory device of claim 9, wherein the parity-scan and refresh operations occur during a different scan period.

16. A memory device comprising:
   a plurality of memory cells organized as an array of rows and columns;
   parity-scan logic adapted to perform parity scan operations on the memory cells;
   a plurality of register fields, said register fields containing information regarding the memory device; and
   means for determining whether a parity-scan operation can be substituted for a refresh operation; and
   means for performing the parity-scan operation instead of the refresh operation when it is determined that the parity-scan operation can be substituted for the refresh operation.

17. The memory device of claim 16, wherein said performing means further comprises means for performing parity-scan operations instead of refresh operations in a scan period until all rows in the memory device have been parity-scanned.

18. The memory device of claim 17, wherein on completion of scanning all rows and before a maximum time interval in which it is desirable to have all rows parity-scanned has expired, said performing means further comprises means for continuing the performance of parity-scan operations instead of refresh operations at a first row of the device.

19. The memory device of claim 17, wherein on completion of scanning all rows and before a maximum time interval in which it is desirable to have all rows parity-scanned has expired, said performing means further comprises means for performing refresh operations at a first row of the device until it is time to perform another parity-scan operation.

20. The memory device of claim 16, wherein said performing means further comprises means for performing parity-scan operations for a dual purpose of performing scan and refresh operations for rows in the memory device until a maximum time interval in which it is desirable to have all rows parity-scanned has expired.

21. The memory device of claim 20, wherein the parity-scan and refresh operations occur during a same scan period.

22. The memory device of claim 16, wherein said performing means further comprises:
   means for performing parity-scan operations for a dual purpose of performing scan and refresh operations in a first scan period for rows in the memory device; and
   means for performing parity-scan operations for a dual purpose of performing scan and refresh operations in a second scan period for other rows in the memory device.

* * * * *